United States Patent
Ou et al.

(10) Patent No.: US 9,640,942 B2
(45) Date of Patent: May 2, 2017

(54) NARROW LINE-WIDTH LASER CHARACTERIZATION BASED ON BI-DIRECTIONAL PUMPED BRILLOUIN RANDOM FIBER LASER

(71) Applicant: University of Ottawa, Ottawa (CA)

(72) Inventors: Zhonghua Ou, Ottawa (CA); Xiaoyi Bao, Ottawa (CA); Yang Li, Ottawa (CA); Liang Chen, Ottawa (CA)

(73) Assignee: University of Ottawa, Ottawa, Ontario (CA)

( * ) Notice: Subject to any disclaimer, the term of this patent is extended or adjusted under 35 U.S.C. 154(b) by 0 days.

(21) Appl. No.: 15/144,919

(22) Filed: May 3, 2016

(65) Prior Publication Data
US 2016/0248220 A1 Aug. 25, 2016

Related U.S. Application Data (62) Division of application No. 14/514,484, filed on Oct. 15, 2014, now Pat. No. 9,356,421.
(Continued)

(51) Int. Cl.
*H01S 3/30* (2006.01)
*H01S 3/094* (2006.01)
(Continued)

(52) U.S. Cl.
CPC ........ *H01S 3/302* (2013.01); *H01S 3/094011* (2013.01); *H01S 3/1608* (2013.01);
(Continued)

(58) Field of Classification Search
CPC ........ H01S 3/302; H01S 5/146; H01S 3/1608; H01S 3/094011; H01S 3/30; H01S 3/0014
See application file for complete search history.

(56) References Cited

U.S. PATENT DOCUMENTS

| | | | |
|---|---|---|---|
| 5,764,359 A * | 6/1998 | Lyu | G01J 9/00 356/477 |
| 5,815,308 A * | 9/1998 | Kim | H01S 3/10023 359/334 |

(Continued)

OTHER PUBLICATIONS

S. Smith, F. Zarinetchi, and S. Ezekiel, "Narrow-line-width stimulated Brillouin fiber laser and applications," Opt. Lett. 16(6), 393-395 (1991).
(Continued)

*Primary Examiner* — Xinning Niu
(74) *Attorney, Agent, or Firm* — Miles & Stockbridge P.C.; Ajay A. Jagtiani (57) ABSTRACT

A method and apparatus for launching optical pump signals into a disordered gain medium at two points thereby producing a narrow line-width random fiber laser within the disordered gain medium. The optical pump signals are propagated in a direction through the disordered gain medium towards one another. The apparatus may comprise an optical gain fiber having a first end configured to receive a first fiber pump signal and a second end configured to receive a second fiber pump signal such that the first fiber pump signal and the second fiber pump signal propagate within the optical gain fiber in a direction towards one another. An optical loss device is coupled to the optical gain fiber, wherein the optical loss device isolates a narrow line-width random fiber laser signal from a signal generated within the optical gain fiber.

16 Claims, 9 Drawing Sheets

Related U.S. Application Data (60) Provisional application No. 62/004,265, filed on May 29, 2014.

(51) Int. Cl.
  *H01S 5/14* (2006.01)
  *H01S 3/16* (2006.01)
  *H01S 3/00* (2006.01)

(52) U.S. Cl.
  CPC ............. *H01S 3/30* (2013.01); *H01S 5/146* (2013.01); *H01S 3/0014* (2013.01)

(56) References Cited

U.S. PATENT DOCUMENTS

| | | | |
|---|---|---|---|
| 2005/0078716 A1 | 4/2005 | Liu | |
| 2005/0152025 A1 | 7/2005 | Hainberger et al. | |
| 2013/0163620 A1* | 6/2013 | Lecoeuche | H04B 10/572 372/20 |
| 2014/0043674 A1* | 2/2014 | Takasaka | H04B 10/294 359/334 |

OTHER PUBLICATIONS

E. Ip, A. P. Lau, D. J. Barros, and J. M. Kahn, "Coherent detection in optical fiber systems," Opt. Express 16(2), 753-791 (2008).
F. Mihélic, D. Bacquet, J. Zemmouri, and P. Szriftgiser, "Ultrahigh resolution spectral analysis based on a Brillouin fiber laser," Opt. Lett. 35(3), 432-434 (2010).
J. Geng, S. Staines, and S. Jiang, "Dual-frequency Brillouin fiber laser for optical generation of tunable low-noise radio frequency/microwave frequency," Opt. Lett. 33(1), 16-18 (2008).
X. Bao, L. Chen, "Recent progress in distributed fiber optic sensors," Sensors 12(7): 8601-8639 (2012).
K. N. Choi, H. F. Taylor, "Spectrally stable Er-fiber laser for application in phase-sensitive optical time-domain reflectometry," IEEE Photon. Technol. Lett. 15(3), 386-388 (2003).
J. Geng, C. Spiegelberg, S. Jiang, "Narrow line-width fiber laser for 100-km optical frequency domain reflectometry," IEEE Photon. Technol. Lett. 17(9), 1827-1829 (2005).
J. M. Campos, A. Destrez, J. Jacquet and Z. Toffano, "Ultra-fast optical spectrum analyzer for DWDM applications," IEEE Trans. Instrum. Meas. 53(1), 124-129 (2004).
L.B. Mercer, "1/f frequency noise effects on self-heterodyne linewidth measurements," IEEE J. Lightwave Technol. 9 (4), 485-493 (1991).
T. Takakura, K. Iga, T. Tako, "Line-width measurement of a single longitudinal mode AlGaAs laser with Fabry-Perot Interferometer," Jpn. J. Appl. Phys. 19(12), L725-L727 (1980).
E. Ip, J. M. Kahn, D. Anthon, and J. Hutchins, "Line-width measurements of mems-based tunable lasers for phase-locking applications," IEEE Photon. Technol. Lett. 17(10):2029-2031 (2005).
L. D. Turner, K.P. Weber, C. J. Hawthorn, and R. E. Scholten, "Frequency noise characterization of narrow line-width diode lasers," Opt. Commun. 201(4-6): 391-397 (2002).
T. Okoshi, K. Kikuchi, A. Nakayama, "Novel method for high resolution measurement of laser output spectrum," Electron. Lett. 16(16), 630-631 (1980).
L. Richter, H. I. Mandelberg, M. Kruger and P. McGrath, "Linewidth determination from self-heterodyne measurements with subcoherence delay times," IEEE J. Quantum Electron. 22(11), 2070-2074 (1986).
M. Han, A. Wang, "Analysis of a loss-compensated recirculating delayed self-heterodyne interferometer for laser line-width width measurement," Appl. Phys. B 81(1), 53-58 (2005).
X. Chen, M. Han, Y. Zhu, B. Dong and A. Wang, "Implementation of a loss-compensated recirculating delayed self-heterodyne interferometer for ultranarrow laser line-width measurement," Appl. Opt. 45(29), 7712-7717 (2006).
J. Reid, D. T. Cassidy, R. T. Menzies, "Line-width measurements of tunable diode lasers using heterodyne and etalon techniques," Appl. Opt. 21(21), 3961-3965 (1982).
J. M. S. Domingo, J. Pelayo, F. Villuendas, C. D. Heras, and E. Pellejer, "Very High Resolution Optical Spectrometry by Stimulated Brillouin Scattering," IEEE Photon. Technol. Lett. 17(4), 855-857 (2005).
P. Sevillano, J. J Subias, C. Heras, J. Pelayo and F. Villuendas, "Brillouin induced self-heterodyne technique for narrow line width measurement," Opt. Express 18(14), 15201-15206 (2010).
M. Pang, S. Xie, X. Bao, D. Zhou, Y. Lu and L. Chen, "Rayleigh scattering-assisted narrow line-width Brillouin lasing in cascaded fibers," Opt. Lett. 37(15), 3129-3131 (2012).
A. Yeniay, J. M. Delavaux, and J. Toulouse, "Spontaneous and stimulated Brillouin scattering gain spectra in optical Fibers," IEEE J. Lightwave Technol. 20(8), 1425-1432 (2002).
A. A. Fotiadi, R. V. Kiyan, "Cooperative stimulated Brillouin and Rayleigh backscattering process in optical fiber," Opt. Lett. 23(23), 1805-1807 (1998).
R. W. Boyd, and K. Rzazewski, "Noise initiation of stimulated Brillouin scattering," Phys. Rev. A 42(9), 5514-5521 (1990).
H. Cao, "Lasing in random media," Waves in random media 13(3), R1-R39 (2003).
T. Kessler, C. Hagemann, C. Grebing, T. Legero, U. Sterr, F. Riehle, M. J. Martin, L. Chen and J. Ye, "A sub-40-mHz-line-width laser based on a silicon single-crystal optical cavity," Nat. Photon. 6(10), 687-692 (2012).
Yamashita et al., "Wavelength, bidirectional Brillouin/erblum fiber ring laser pumped with an Intracavity fiber DFB laser", Lasers and Electro-Optics, CLEO '98, Technical Digest, Summaries of papers presented at the Conference on; Cth046, (1998).
Sevillano et al., "Brillouin induced self-heterodyne technique for narrow line width measurement", Optics Express, vol. 18, No. 14, pp. 15201-15206 (2010).
International Search Report and Written Opinion of the International Searching Authority received in PCT Application No. PCT/IB2014/065377 mailed Feb. 20, 2015.
Pang et al., "Rayleigh scattering-assisted narrow linewidth Brillouin lasing in cascaded fiber", Optics Letters, vol. 37, No. 15 (2012).
Office Action received in Canadian Application No. 2,948,974 mailed Dec. 15, 2016.
Yamashita et al., "Multiwavelength, bidirectional Brillouin/Erbium fiber ring laser pumped with an intracavity fiber DFB laser", Lasers and Electro-Optics, CLEO 98, Technical Digest, Summaries of papers presented at the Conference on; Cth046 (1998).

* cited by examiner

NARROW LINE-WIDTH LASER CHARACTERIZATION BASED ON BI-DIRECTIONAL PUMPED BRILLOUIN RANDOM FIBER LASER

This application is a divisional application of U.S. application Ser. No. 14/514,484, filed Oct. 15, 2014, which claims benefit of priority to U.S. Provisional Patent Application No. 62/004,265, entitled, "NARROW LINE-WIDTH LASER CHARACTERIZATION BASED ON BI-DIRECTIONAL PUMPED BRILLOUIN RANDOM FIBER LASER," filed May 29, 2014 which is incorporated herein by reference in its entirety.

BACKGROUND

Field of the Invention

The present invention relates to random fiber lasers. More specifically, the present invention is directed to narrow line-width Brillouin random fiber laser (BRFL) and laser characterization technique based on the BRFL.

Related Art

Narrow line-width lasers have utility in a wide range of applications, such as optical fiber sensing, satellite and optical fiber communication, high resolution spectroscopy, microwave generation and so on.[1,2,3,4] A narrow line-width property allows for greater transport capacity and range which is useful for high data rate coherent optical communication system. Narrow line-width lasers such as single mode (SM) fiber lasers or tunable external cavity lasers (ECL), for example, with line-widths in the range of 1 kHz to sub-MHz, are increasingly used as the pump lasers in optical interferometric and fiber sensing systems such as optical interferometers, Brillouin optical time domain reflectometer (BOTDR), phase-sensitive optical time domain reflectometer (Phase-OTDR) and optical frequency domain reflectometer (OFDR).[5,6,7] Reliable characterization of laser line-width is a key requirement for many laser-based applications. However, conventional methods and systems for laser line-width measurement either offer insufficient measurement resolution or require costly operational features which can limit their intended application scope.

The highest spectral resolution of diffraction grating based instruments such as optical wavelength meter or optical spectrum analyzer (OSA) is generally in the range of a few MHz, which is not adequate for characterization of sub-MHz line-width laser.[8,9] The spectral resolution of Scanning Fabry-Perot interferometers (FPI) are typically in the order of MHz, or sub-MHz with small a tuning range (~1 GHz).[10]

Commonly used homodyne and self-heterodyne techniques based on Mach-Zehnder interferometers (MZI), often applied to measure the laser line-width, can achieve a high resolution.[11,12] However, in order to realize a high resolution (e.g. kHz range), an ultra-long delay requiring hundreds of kilometers of delay fiber may be required in both cases. In addition, an external frequency shifter is generally required in order to shift the detected frequency away from the zero frequency of Electrical Spectrum Analyzer (ESA) in order to avoid the low frequency noise (1/f-noise). To avoid the extremely long delay fiber and its induced high loss, the loss-compensated recirculating delayed self-heterodyne interferometer (LC-RDSHI) has been developed for measuring ultra-narrow line-widths.[13,14] In this system the delay fiber does not need to be longer than the laser coherence length, but the multi-interferences from recirculation may affect the measurement accuracy. Heterodyne technique is an effective method for high resolution line-width measurement, however it requires a reference laser source with a narrower line-width than that of the test laser and a center frequency that is close to that of the test laser in order for the resulting beat signal to be within the operating bandwidth of the photo-detector (less than tens of GHz).[15]

Recently the heterodyne method based on Brillouin fiber ring laser (BFRL) has been used to achieve high resolution spectral analysis and line-width measurement.[16,17] This method involves the detection of the heterodyne signal between the test laser and a BFRL signal resulting in measurement resolution of 300 Hz[18]. However, its implementation requires two laser sources.[19] Accordingly, since the narrow line-width property is of key importance in a multitude of applications, a high resolution line-width characterization technique for ensuring that a laser meets the performance requirements of the particular application for which it is being utilized is highly desirable.

SUMMARY

The foregoing needs are met, to a great extent, by the present invention wherein, according to a first broad aspect, the present invention provides a method comprising launching at least two optical pump signals into a disordered gain medium at two points thereby producing a narrow line-width random fiber laser within the disordered gain medium. The method may also include propagating the at least two optical pump signals in a direction through the disordered gain medium towards one another.

According to a second broad aspect, the present invention provides an apparatus comprising an optical gain fiber having a first end configured to receive a first fiber pump signal and a second end configured to receive a second fiber pump signal such that the first fiber pump signal and the second fiber pump signal propagate within the optical gain fiber in a direction towards one another. The apparatus may further include an optical loss device coupled to the optical gain fiber, wherein the optical loss device isolates a narrow line-width random fiber laser signal from a signal generated within the optical gain fiber.

According to a third broad aspect, the present invention provides an apparatus comprising a pump signal supply element, an optical gain fiber configured to the pump signal supply element, wherein the pump signal supply element is configured to supply a first fiber pump signal to the optical gain fiber. The pump signal supply element is configured to supply a second fiber pump signal to the optical gain fiber. The first fiber pump signal and the second fiber pump signal propagate within the optical gain fiber in a direction towards one another. An optical loss device is coupled to the optical gain fiber, wherein the optical loss device isolates a narrow line-width random fiber laser signal from a signal generated within the optical gain fiber.

According to a fourth broad aspect, the present invention provides a method for comprising producing at least two optical pump signals from an optical pump source and launching the at least two optical pump signals into a disordered gain medium at two points such that the optical pump signals propagate in a direction through the disordered gain medium towards one another. The method may also include measuring the line-width of the optical signal generated within the optical gain fiber to thereby characterize the line-width of the optical pump source.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

DETAILED DESCRIPTION OF THE PREFERRED EMBODIMENTS

Definitions

Where the definition of terms departs from the commonly used meaning of the term, applicant intends to utilize the definitions provided below, unless specifically indicated.

For purposes of the present invention, it should be noted that the singular forms, "a," "an" and "the," include reference to the plural unless the context as herein presented clearly indicates otherwise.

For purposes of the present invention, directional terms such as "top," "bottom," "upper," "lower," "above," "below," "left," "right," "horizontal," "vertical," "up," "down," etc., are used merely for convenience in describing the various embodiments of the present invention. The embodiments of the present invention may be oriented in various ways. For example, the diagrams, apparatuses, etc., shown in the drawing figures may be flipped over, rotated by 90° in any direction, reversed, etc.

For purposes of the present invention, a value or property is "based" on a particular value, property, the satisfaction of a condition or other factor if that value is derived by performing a mathematical calculation or logical operation using that value, property or other factor.

For the purpose of the present invention, the term "optical interference signal" refers to the optical signal that results from the superimposition of at least two optical signals with different frequency.

For purposes of the present invention, the term "beat signal" refers to an interference signal produced by the superimposition of at least two signals with different frequencies. The frequency of the beat signal corresponds to the frequency difference between the superimposed signals.

For purposes of the present invention, the term "bi-directional optical pumping" refers to optically pumping a disordered gain medium, such as an optical gain fiber, from opposite ends. Bi-directional optical pumping may occur via counter-propagating pump signals, such that the pump signals propagate in a direction through the disordered gain medium towards one another.

For the purpose of the present invention, the term "Brillouin scattering" refers to optical scattering that takes place due to the presence of acoustic phonons within the gain medium.

For the purpose of the present invention, the term "Brillouin frequency shift" refers to a down-shift in frequency experienced by a portion of a light signal that has undergone Brillouin scattering.

For purposes of the present invention, the term "Brillouin stokes light" refers to a light signal back-scattered by acoustic phonons within a gain medium. The reflected stokes signal undergoes a down-shift in frequency relative to an incident signal by an amount that corresponds to the Brillouin frequency shift (BFS) parameter of the gain medium.

For purposes of the present invention, the term "counter-propagating" refers to describing two beams of light that are propagating in opposite directions through the same medium.

For purposes of the present invention, the term "gain medium" refers to a medium that acts as a source of optical gain for the light signal propagating therethrough.

For purposes of the present invention, the term "disordered gain medium" refers to a gain medium with a disordered structure that amplifies the light propagating through it via random multiple scattering of photons. An optical gain fiber is an example of a disordered gain medium.

For purposes of the present invention, the term "dual end pumped optical gain fiber" refers to an optical gain fiber that is optically coupled at each of the fiber ends, for example, to an optical pump signal.

For purposes of the present invention, the term "fiber pump signal" refers to an optical pump signal inputted into an optical gain fiber.

For purposes of the present invention, the term "first signal portion" refers to one of at least two secondary signals derived, induced or generated from a primary optical pump signal.

For purposes of the present invention, the term "optical amplifier" refers to a device capable of amplifying an optical signal. In some embodiments, the optical amplifier may amplify an optical signal directly, without the need to first convert the optical signal to an electrical signal. An optical amplifier may be thought of as a laser without an optical cavity, or one in which feedback from the cavity is suppressed.

For purposes of the present invention, the term "optical circulator" refers to a multi-port optical device that may be used to route optical signals in such a way as to separate optical signals travelling in opposite directions.

For purposes of the present invention, the term "optical input segment" refers to a part of a system that generates one or more optical pump signals and may include an interface for transmission, reception, and/or delivery of one or more (internally or externally generated) optical pump signals.

For purposes of the present invention, the term "optical coupling" refers to transfer of optical energy from an optical source, medium, device, interface or conduit through an intermediary structure onto a target.

For purposes of the present invention, the term "random fiber" refers to an optical fiber that acts as disordered gain medium for the light signal propagating through it.

For purposes of the present invention, the term "optical isolator" refers to an optical component which allows the transmission of light in only one direction.

For purposes of the present invention, the term "optical loss device" refers to a device for isolating a select frequency range from a set of frequencies contained within a signal.

For purposes of the present invention, the term "optical pump signal" refers to the optical signal launched into optical gain fiber in order to provide the initial energy required to initiate lasing.

For purposes of the present invention, the term "pumping" refers to the transfer of energy into a gain medium of a laser in order to initiate a lasing process.

For purposes of the present invention, the term "pump wavelength" refers to a wavelength of light contained within or associated with a pump signal.

For purposes of the present invention, the term "propagating" refers to causing to spread to extend; to impel or continue forward in space; e.g., as, to propagate light.

For purposes of the present invention, the term "second signal portion" refers to one of at least two secondary signals derived, induced or generated from a primary optical pump signal.

Description

While the present invention is disclosed with references to certain embodiments, numerous modification, alterations, and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof. It is understood that other embodiments may be utilized and structural changes may be made without departing from the scope of the invention.

Conventional systems have utilized a multi-segmented fiber layout, such as a cascaded three segment gain fiber, to produce a narrow line-width BRFL. In this case, the Rayleigh back scattering of the Stokes signal in the first and the third sections of the fiber has been shown to increase the distributed Rayleigh feedback in the middle fiber segment to form a random fiber laser with narrow line-width.[19] However, because of the high loss in the open ended fiber, the laser line-width was limited to a few kHz. In order to reduce the loss of the Brillouin random laser at the output end, the present invention contemplates a bi-directional pump utilized at both ends of a fiber, as described below in select disclosed embodiments.

Accordingly, disclosed embodiments of the present invention provide a method and apparatus for the generation of an ultra-narrow line-width random fiber laser based on bi-directional SBS amplification of the Rayleigh back-scattered stokes signal to provide enhanced feedback mechanism and reduced signal loss. As a result, improved lasing efficiency and a significantly narrowed line-width is achieved through bi-directional optical pumping of a fiber gain medium.

Figure 1:
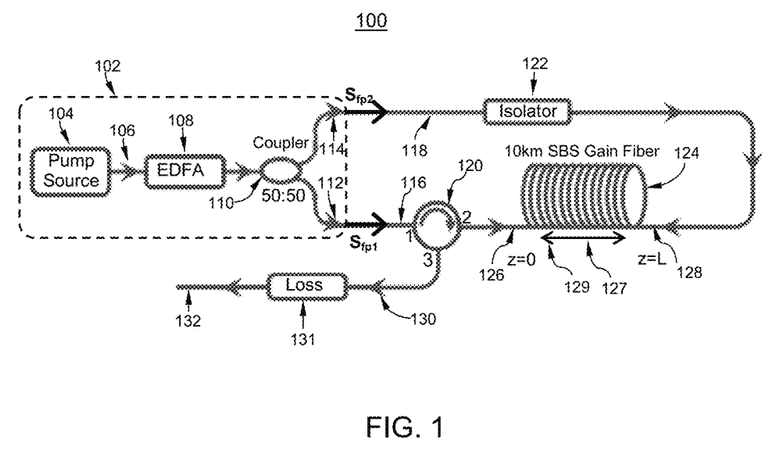
FIG. 1 is a schematic illustration of an exemplary configuration for demonstrating the operation principle of a bi-directional pumped Brillouin Random Fiber Laser (BRFL), according to one embodiment of the present invention.

Turning to FIG. 1, a schematic illustration of a bi-directionally pumped BRFL system 100 is provided according to one embodiment of the present invention. The BRFL system 100 may include a pump-signal supply element 102 for providing or launching at least a first fiber pump signal and a second fiber pump signal, denoted in FIG. 1 as $S_{fp1}$ and $S_{fp2}$, respectively. Pump-signal supply element 102 may include a pump source 104 for generating and/or launching a source pump signal 106. The source pump signal 106 may be provided through a variety of devices including, for example, a semiconductor pump laser, laser diode pump, optical fiber laser or other devices appropriate for generating pump signals. In one disclosed embodiment, the source pump signal 106 is provided by a single-mode fiber laser (SMFL) operating at a wavelength of approximately 1550 nm. In another embodiment an external cavity laser (ECL) operating, for example, at a wavelength of approximately 1548 nm maybe used as pump source 104 to generate source pump signal 106.

In addition to the pump source 104, pump-signal supply element 102 may also include an optical amplifier such as an erbium-doped fiber amplifier (EDFA) device 108 for amplifying source pump signal 106 and an optical coupler 110 for splitting the source pump signal 106 into, for example, a first signal portion 112 and a second signal portion 114. It is noted that while the disclosed embodiment provides an EDFA device 108, any optical amplifier sufficient for amplifying the optical signal may be utilized. In one disclosed embodiment, optical coupler 110 has a 50:50 splitting ratio for splitting the source pump signal 106 into two equal signal portions such as first signal portion 112 and second signal portion 114.

First signal portion 112 propagates across a first pump-signal delivery path 116, for example, as fiber pump signal $S_{fp1}$ is launched into the optical gain fiber at fiber end 126. Second signal portion 114 propagates across the second pump-signal delivery path 118, for example, as fiber pump signal $S_{fp2}$ is launched into the optical gain fiber at fiber end 128. First pump-signal delivery path 116 carrying first fiber pump signal $S_{fp1}$ may be optically coupled to fiber end 126 (fiber span location z=0) of an optical gain fiber 124. In one disclosed embodiment, a multi-port circulator 120 is provided to couple first-pump signal delivery path 116 to fiber end 126. Multi-port circulator 120 may be configured, for example, as a three-port optical circulator wherein first pump-signal delivery path 116 is optically coupled to fiber end 126 such as through port 1 and 2. Second pump-signal delivery path 118 carrying second fiber pump signal $S_{fp2}$ may be optically coupled to fiber end 128 (fiber span location z=L) of optical gain fiber 124, for example, through an optical isolator 122. In one disclosed embodiment, optical gain fiber 124 is a 10 km SMF28 SBS gain fiber.

As described, fiber pump signals $S_{fp1}$ and $S_{fp2}$ may be provided by pump-signal supply element 102 using a single pump source whose output signal is amplified and equally split into two fiber pump signals. Although FIG. 1 illustrates the use of a pump-signal supply element 102 for launching or providing the fiber pump signals, the enclosed arrangement is not meant to be limiting, and hence, is not absolutely required by the present invention. For example, fiber pump signals $S_{fp1}$ and $S_{fp2}$ may be provided through any available range of optical signal generation and conditioning devices. For example, in an exemplary alternative embodiment, fiber pump signals $S_{fp1}$ and $S_{fp2}$ may be provided externally by a variety of available electronic devices sufficient for optical signal generation and conditioning. Hence, an important aspect of the invention includes an ability to provide bi-directional optical pumping of the optical gain fiber with optical pump signals travelling in a direction through the optical gain fiber towards one another. Thus, in select embodiments, the disclosed invention provides bi-directional optical pumping of the optical gain fiber with counter-propagating optical pump signals.

The interaction of the dual counter-propagating fiber pump signals, $S_{fp1}$ and $S_{fp2}$ with the optical gain fiber 124 results in a two-way SBS-based amplification of the Rayleigh back-scattered Brillouin stokes wave within the optical gain fiber 124. The two-way amplification of the Rayleigh distributed feedback signal leads to a rapid build-up in intensity and spectral narrowing of a bi-directional Brillouin Stokes signal 127 within the optical gain fiber 124. As illustrated in FIG. 1, the directional narrow-line-width Brillouin laser 129 propagating towards fiber end 126 at fiber span location z=0 is outputted from optical gain fiber 124, for example, through port 3 of optical circulator 120 and appears as optical signal 130 out of port 3 of the optical circulator 120. The spectral content of the signal 130 contains frequency components associated with both the narrow-line-width Brillouin stokes wave 127 and the source pump signal 106. Signal 130 is then processed with an optical loss device 131, such as a narrow bandwidth optical filter, in order to filter out the pump frequency components and produce a narrow-line-width Brillouin Random Fiber Laser 132 in accordance to the principals disclosed by the present invention.

It should be noted that although the narrow-line-width BRFL output has been obtained from the optical gain fiber 124 at the span location z=0 as illustrated FIG. 1, other span locations may be selected and utilized by the disclosed invention to obtain the BRFL output. In accordance to alternative embodiments, the BRFL output 132 may be obtained at selected other locations, for example, from the fiber end 128 at the span location z=L or, alternatively, from both fiber ends 126 and 128 at span locations z=0 and z=L simultaneously with appropriate selection and placement of the disclosed optical coupling elements.

Figure 2:
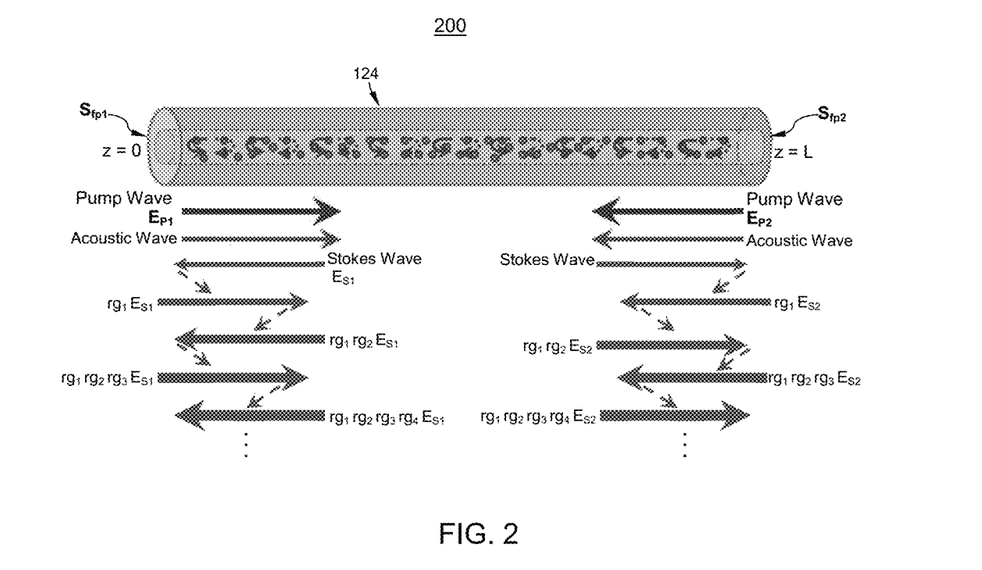
FIG. 2 is an illustration of a Brillouin Stokes light backscattered by the scattering centers in Rayleigh feedback fiber, according to one embodiment of the present invention.

The dynamics of the interaction between fiber pump signals and the generated Stokes signals inside the optical gain fiber is illustrated in FIG. 2. As the fiber pump signal $E_{p1}$ ($E_{p2}$) is injected into the optical gain fiber, represented in one embodiment by a 10 km single mode SBS gain fiber, at the z=0 (L) point along the fiber span, the spontaneous Stokes wave $E_{s1}$ ($E_{s2}$), initiated from thermal noise, propagates in the opposite direction of fiber pump wave $E_{p1}$ ($E_{p2}$) with frequency downshift 0f approximately 10.9 GHz relative to fiber pump wave. As the pump power increases, the onset of stimulated bi-directional stimulated Brillouin scattering, through the electrostriction process, leads to a more efficient pump-to-stokes signal power conversion which results in the amplification of the Stokes wave $E_{s1}$ ($E_{s2}$).[20] A fraction of the SBS amplified Stokes wave $E_{s1}$ ($E_{s2}$) is reflected back via Rayleigh backscattering. The magnitude of the Rayleigh backscattered component of the Stokes wave, representing the Rayleigh feedback signal, is determined by the weak Rayleigh scattering coefficient r (<0.1%). The weak Rayleigh backscattered stokes signal $rE_{s1}$ ($rE_{s1}$) is amplified by the counter-propagating fiber pump signal $E_{p2}$ ($E_{p1}$) according to the Brillouin gain factor $g_B$ (40-60 dB depending on the length of the optical gain fiber) which compensates for the weak Rayleigh backscattering, as $rg_B \gg 1$[21], resulting in a net gain effect in the distributed feedback signal provided by the amplified Rayleigh back-scattered stokes signal $rg_B E_{s1}$ ($rg_B E_{s2}$).

In the second round trip, portion of the amplified Rayleigh scattered stokes signal $rg_B E_{s1}$ ($rg_B E_{s2}$) will be back-scattered again and re-amplified, through the SBS process, by the counter-propagating fiber pump signal $E_{p1}$ ($E_{p2}$) simultaneously. The resulting stokes signal $rg_B rg_B E_{s1}$ ($rg_B rg_B E_{s2}$) is sent to the initial end z=0 (L) of the fiber pump signal $E_{p1}$ ($E_{p2}$). This double Rayleigh-scattered stokes signal provides a coherent feedback to the newly generated Stokes signal $E'_{s1}$ ($E'_{s2}$),[21] and acts as the seed of the new SBS amplification process. This bi-directional self-feedback seeding and amplification effect continues to increase the coherence length of the BRFL over many round trips at both fiber ends in a fashion similar to that of the standing cavity laser. The continuous amplification of the distributed Rayleigh feedback signal results in the coherence length being increased from a few meters associated with the Brillouin scattering process[22] to thousands of kilometers. The result is a BRFL with an ultra-narrow line-width.

When the phase difference between the newly generated stokes wave $E_s'|z=0(L)$ and Rayleigh feedback stokes signal $E_{Rs}|z=0(L)$ is an integral multiple of $2\pi$, the constructive interference of the stoke signals will occur at the resonant frequency, and a coherent random lasing spike with ultra-narrow line-width will appear at the top of the SBS Brillouin spectrum. As the line-width of the pump laser and BRFL is below MHz, an optical filter with narrow bandwidth can filter out wavelengths associated with the fiber pump signal to isolate the narrow line-width Stokes signal as the BRFL output. In a particular embodiment of the present invention, a filter with a narrow bandwidth of approximately 6 GHz (the optical rejection ratio of higher than 40 dB) is used for filtering out the pump frequencies thereby producing an output signal that is a bi-directional pumped BRFL with a lorentzian line-width of approximately 65 Hz and 75 Hz when a 10 km single mode SBS gain fiber is pumped by a SMFL and ECL, respectively.

The present invention provides a high resolution optical line-width characterization technique based on the bi-directional pumped BRFL system. The disclosed technique, of the present invention, offers improved measurement resolution in comparison to conventional spectral analysis methods while offering a simplified configuration without requiring long sections of delay fiber or costly optical components such as local oscillator, external frequency modulators or any additional optical sources to the test laser that has been selected for line-width characterization. In the immediately disclosed method, frequency displacement and loss of coherence are performed simultaneously and inherently with the bi-directional BRFL, thereby, obviating the need for external optical signal conditioning elements.

Figure 3:
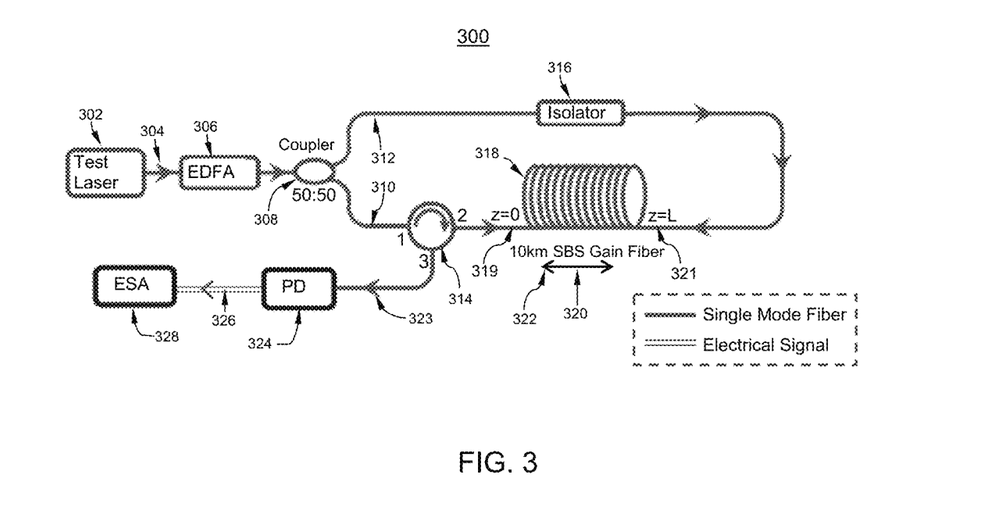
FIG. 3 is a schematic illustration of an exemplary configuration demonstrating a bi-directional pumped BRFL and technique for a high-resolution optical line-width characterization, according to one embodiment of the present invention.
Figure 4:
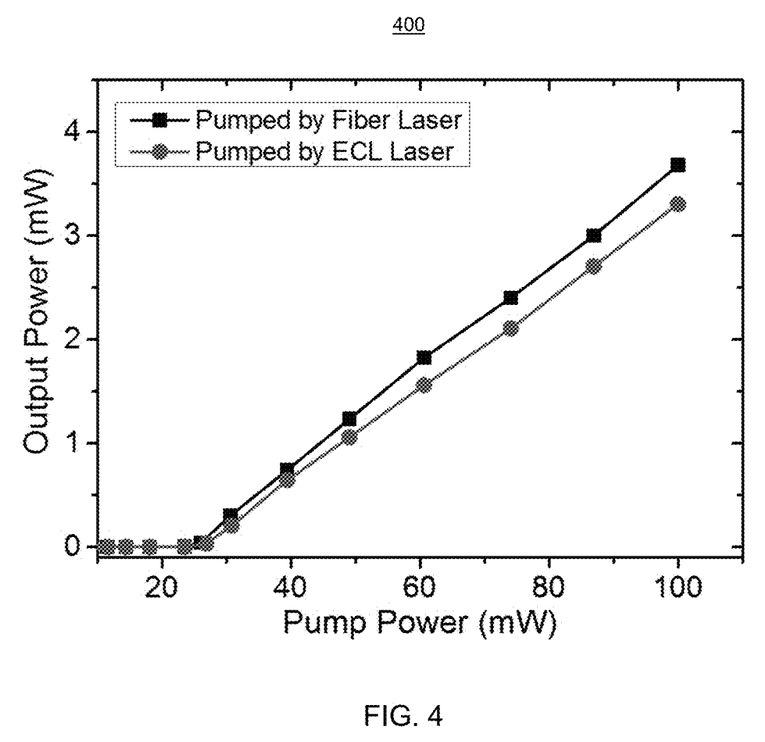
FIG. 4 is a graph illustrating a measured BRFL output power as a function of the optical pump power for a single mode (SM) fiber laser pump and an External Cavity Laser (ECL) pump, according to one embodiment of the present invention.

The High-resolution line-width measurement system 300 in FIG. 3 illustrates the basic structural layout and operation for one embodiment of the BRFL-based line-width characterization method. A test laser 302 selected for line-width characterization is used as the pump source 302 for generating the source pump signal 304 which may be amplified by EDFA device 306 and split into two fiber pump signals 310 and 312 using an optical coupler 308. In one disclosed embodiment, optical coupler 308 has a 50:50 splitting ratio for splitting the source pump signal 304 into two equal signal portions 310 and 312.

Fiber pump signal 310 may be optically coupled to fiber end 319 (fiber span location z=0) of an optical gain fiber 318 via a multi-port optical circulator 314. In one disclosed embodiment, multi-port optical circulator 314 includes a three-port configuration. Fiber pump signal 310 may be optically coupled to fiber end 319 through port 1 and 2 of the three-port optical circulator 314. Fiber pump signal 312 maybe optically coupled to fiber end 321 (fiber span location z=L) of optical gain fiber 318, for example, through an optical isolator 316. In one disclosed embodiment, optical gain fiber 318 is a 10 km SMF28 SBS gain fiber. Bi-directional optical pumping of the optical gain fiber 318 with the source pump signal 304 generates a stokes-shifted BRFL signal within the optical gain fiber 318. The superimposition of the stokes-shifted BRFL signal and the portion of the source pump signal 304 that has not undergone a stokes shift results in an optical interference signal 320. The spectrum of the optical interference signal will therefore contain the narrow line-width associated with the BRFL and the spectral content associated with the test laser 302. The directional component 322 of the bi-directional optical interference signal 320 that is incident upon port 2 of the optical circulator 314 at fiber end 319 (fiber span location z=0) is extracted through port 3 of the optical circulator 314 and denoted on FIG. 3 as signal 323. A photodetector 324 receives the optical interference signal 323 exiting port 3 of optical circulator 314. Since photodetector 324 is inherently a square law detector, it intrinsically mixes any optical frequency incident upon its photosensitive area. Thus resulting electrical signal 326 at the output of photodetector 324 has an oscillation frequency that corresponds to the difference between the frequencies mixed in optical interference signal 320. In this case, the aforementioned difference between the frequencies corresponds to the Brillouin frequency shift (BFS) at approximately 10.9 GHz. Since the BRFL stokes signal has a narrower spectral width than the test laser, the disclosed method offers the advantage that no deconvolution of the photodetector response is further needed. The line-width of the test laser, represented by the spectral width of the photodetector output signal 326, is directly measured with an electrical spectrum analyzer (ESA) 328. The optical resolution of the disclosed BRFL-based method of line-width characterization is set by the line-width of the bi-directionally pumped BRFL, which is approximately 65 Hz for fiber pumped laser and approximately 75 Hz for the ECL pumped laser. Any discrepancy in line-width values are within the margin of error associated with the measurement.

EXAMPLES

Example 1

Lasing Threshold and Line-Width Measurements of the Bi-Directional Pumped BRFL

A disclosed embodiment provides an experimental set up to measure the lasing threshold for the bi-directional pumped BRFL. The lasing threshold measurements are taken using a SMFL source pump and an ECL source pump. A 10 km SBS gain fiber is used as the optical gain fiber. The BRFL may be generated with each source pump according to the bi-directional pumping configuration illustrated, for example, in FIG. 1. In order to reduce any environmental perturbations, the 10 km SBS gain fiber is put into a soundproof box. The laser output powers are measured by adjusting the EDFA gain; the measurements of BRFL power versus pump power for two different pump lasers are shown in FIG. 3. The lasing thresholds are approximately 23 mW and 24 mW when pumped by SMFL and ECL, respectively. In this system, the output power at fiber span location z=L and the insertion loss of the optical filter 144 (approximately 4 dB at Stokes wavelength) are not taken into account. The slope efficiencies of the two lasers were calculated to be approximately 4.78% and 4.39%, respectively, by only using the power at output 148 and the total pump power from EDFA 116. If both factors are considered, the slope efficiencies of the two BRFLs would be higher than 21%.

The precision of the BRFL-based line-width characterization technique is limited by the spectral width of the bi-directional pumped BRFL. Therefore, measuring the line-width of a test laser requires that the line-width of the BRFL is first characterized. As described earlier and illustrated in FIG. 2 the bi-directional pumping of the optical gain fiber produces two counter-propagating BRFL output signals. This inherent two-way lasing characteristic of may be exploited for measuring the line-width of the BRFL without requiring a second set of components and optical gain medium for duplicate signal generation.

Figure 5:
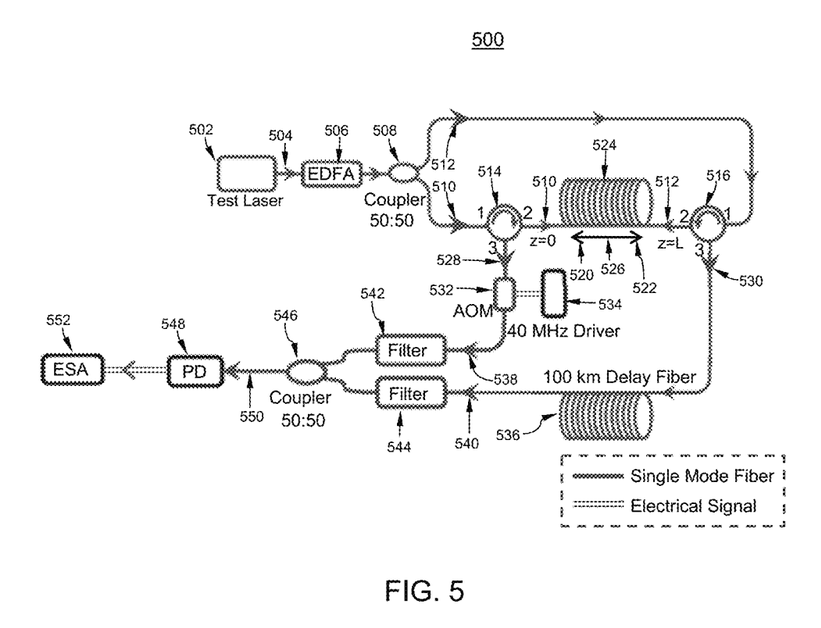
FIG. 5 is a schematic illustration of an exemplary configuration for a line-width measurement of a bi-directional pumped BRFL output using a beat signal of two incoherent BRFLs with the same line-width having a frequency difference of approximately 40 MHz, according to one embodiment of the present invention.

Turning to FIG. 5 a schematic illustration of an experimental set up 500 for BRFL line-width measurement is provided according to one embodiment of the present invention. System 500 may include a test laser 502 for generating a source pump signal 504, an EDFA device 506 for amplifying the source pump signal 504 and a coupler 508 for splitting the source pump signal 504 into two equal signal portions, thereby generating, for example, fiber pump signals 510 and 512. Fiber pump signals 510 and 512 are optically coupled to opposite ends of the optical gain fiber 524 at fiber span locations z=0 and z=L through optical circulator 514 and 516, respectively. The optical coupler disposed at each fiber span, may receive the incoming fiber pump signal, for example, on a first port (e.g., port 1) and launch the fiber pump signal into the respective fiber end, for example, through a second port (e.g., port 2), in order to initiate bi-directional optical pumping of the optical gain fiber 524 which may result in two-way BRFL signal 526 generated within the optical gain fiber 524.

The signal 528 routed out of port 3 of the optical circulator 514, disposed at the fiber span location z=0, is comprised of directional BRFL signal 520 and the portion of the fiber pump signal 512 that has not undergone a stokes shift. Similarly signal 530 routed out of port 3 of the optical circulator 516 at the opposite fiber span location z=L is comprised of directional BRFL signal 522 and portion of the fiber pump signal 510 that has not undergone a stokes shift. Signal 528 is frequency shifted with, for example, an Acousto-Optical Modulator (AOM) 532 driven by 40 MHz rf source 534. On the opposite end, signal 530 is subjected to a time-delay, for example, through a 100 km Delay fiber 536. Thus, two random incoherent laser beams 538 and 540, with frequency difference of 40 MHz but equal line-widths, may be obtained. After pump frequencies are filtered out with narrow bandwidth filters 542 and 544, the resulting narrow-line-width BRFL signals are combined through coupler 546 to produce the optical interference signal 550. The beat signal of the two BRFLs of equal 40 mW is detected by a photodetector 548 and the corresponding power spectrum is measured with Electrical Spectrum Analyzer (ESA) 552 to thereby obtain the line-width of BRFL.

Figure 6:
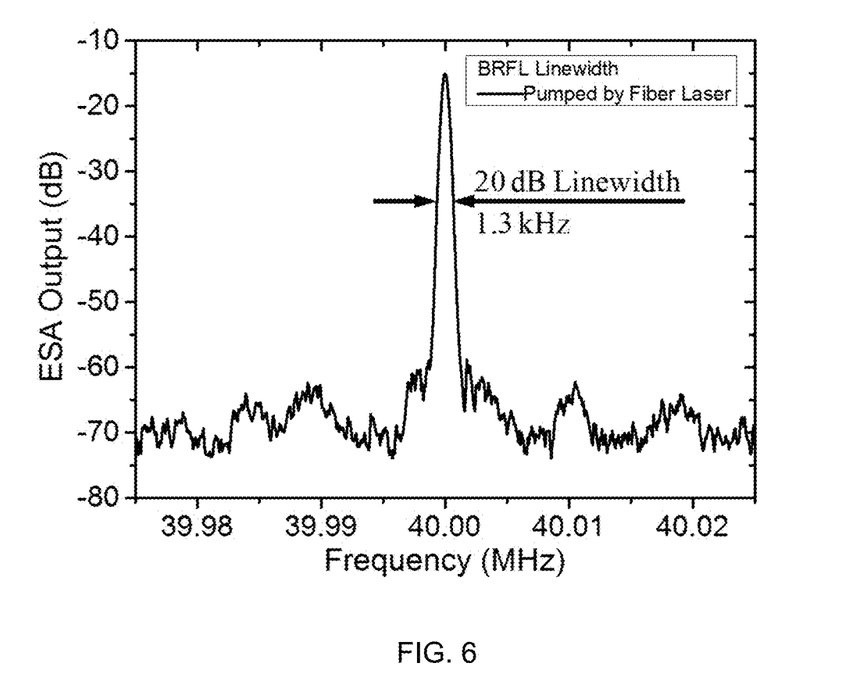
FIG. 6 is a graph illustrating a power spectrum of a BRFL beat signal pumped with a fiber laser pump source and normalized to approximately 40 MHz with a frequency resolution of about 0.1 KHz, according to one embodiment of the present invention.
Figure 7:
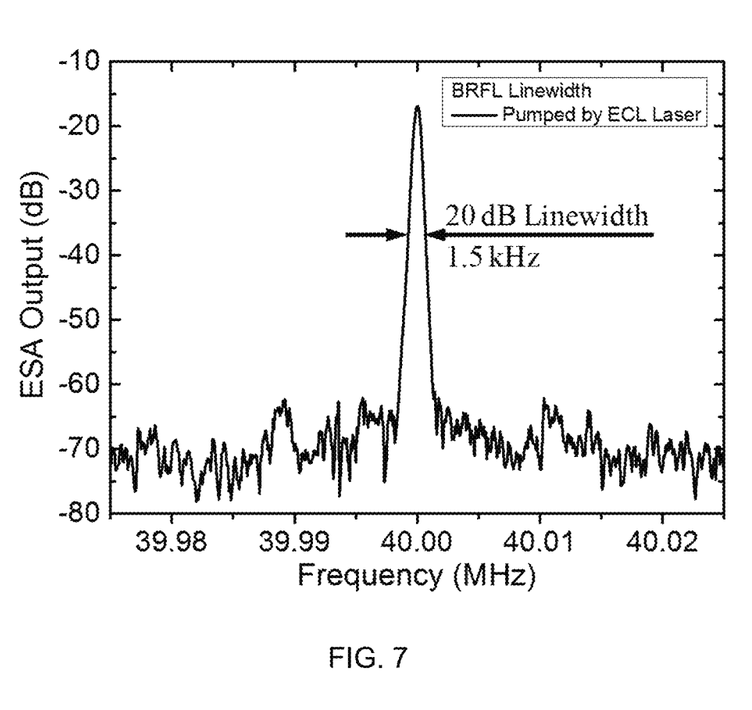
FIG. 7 is a graph showing a power spectrum of a BRFL beat signal pumped with an ECL pump source and normalized to approximately 40 MHz with frequency resolution of about 0.1 KHz, according to one embodiment of the present invention.

Considering the frequency jitter of the lasing spikes, the maximum sweep time of ESA is set to 1 second with 50 kHz span, for the resolution of up to 50 Hz. The measured results by using two different pump lasers as shown in FIG. 5 and FIG. 6, which were averaged over 20 measurements. As the broadening effect of the 1/f frequency noise is most pronounced near the center of the spectral lineshape, if the signal and noise levels permit, a more accurate estimate of the tested laser Lorentzian portion of the line-width can be obtained from the width 10 or 20 dB down from the maximum of the lineshape[24]. However, the line-width (especially the narrow line-width) determined from the width 20 dB down is much closer to the Lorentzian line-width, which equals to the value of spectral lineshape width 20 dB down divided by $2\sqrt{99} \approx 20$.[24] From the power spectrum measurements illustrated in FIG. 5 and FIG. 6, the 20 dB down line-width of the beat signals pumped with different lasers are 1.30 kHz and 1.50 kHz, which corresponds to the bi-directional pumped BRFL Lorentzian line-widths of 65 Hz and 75 Hz, respectively. The difference in the result is within the error bar.

Example 2

Line-Width Measurement of Two Pump Lasers BRFL

Figure 8:
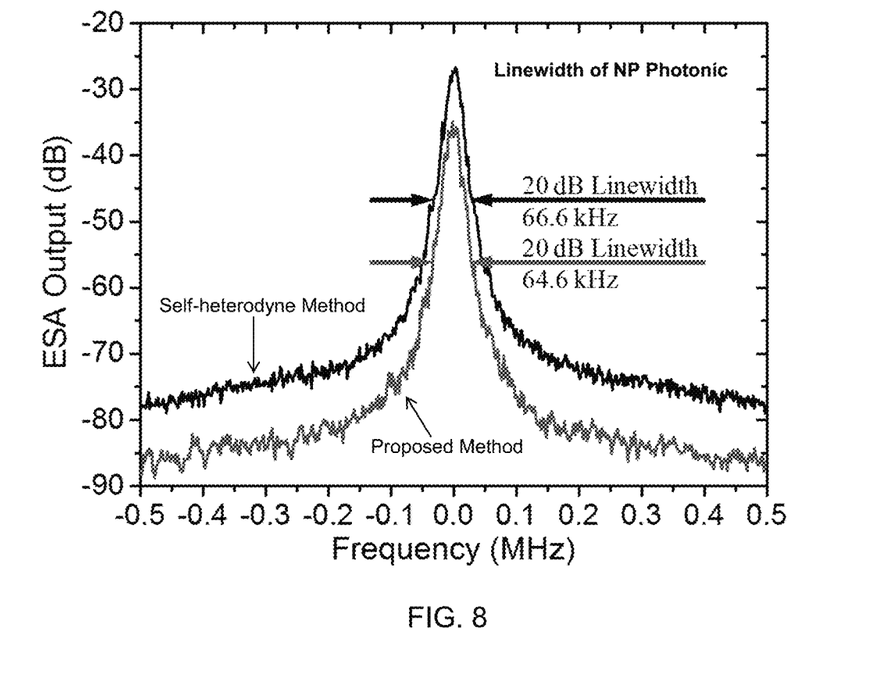
FIG. 8 is a graph illustrating a power spectrum of a beat signal for a single mode (SM) fiber laser pump source measured via a conventional self-heterodyne method and a bi-directional pumped BRFL based method, respectively, according to one embodiment of the present invention.
Figure 9:
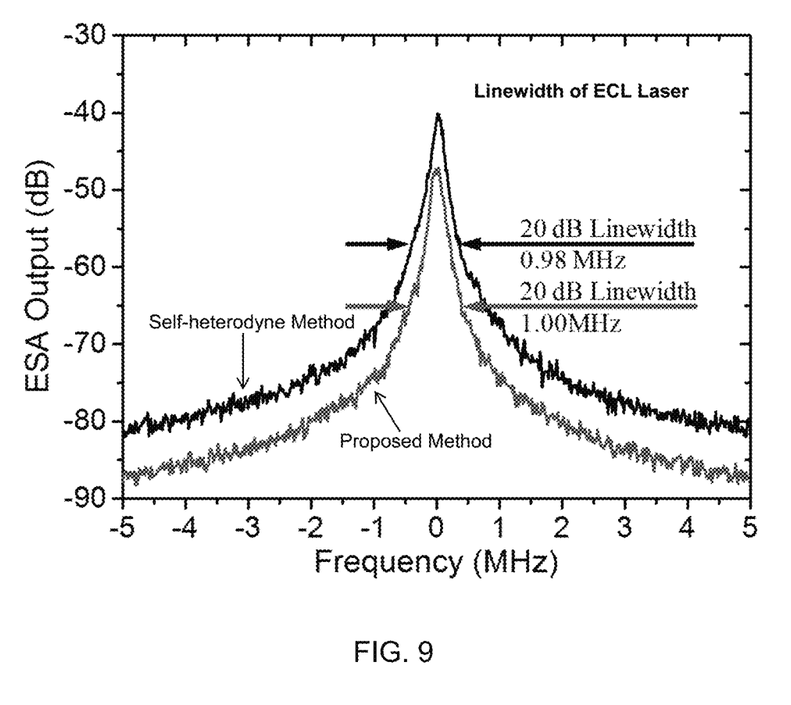
FIG. 9 is a graph illustrating a power spectrum of a beat signal for an ECL pump source measured via a conventional self-heterodyne method and a bi-directional pumped BRFL based method, respectively, according to one embodiment of the present invention.

In order to verify the effectiveness of the novel line-width measurement approach with bi-directional pumped BRFL, the BRFL-based line-width characterization technique was compared with the conventional self-heterodyne method of line-width measurement for two different test lasers (single mode fiber laser and external cavity laser). In the self-heterodyne configuration a frequency down-shift of 40 MHz was provided by AOM, and a 100 km fiber acts as the delay line, corresponding to a resolution of approximately 2 kHz. A photodiode with bandwidth of approximately 350 MHz is used to detect the beat signal and an ESA is used to measure and record the power spectrum of the beat signal. Due to the different line-width of each pump laser, the ESA is set to the spans of 1 MHz and 10 MHz with the sweep time of 1 s, and the corresponding resolution of 200 Hz in both cases, respectively. The normalized spectra, averaged over 20 measurements, are labeled accordingly in the waveform illustrations in FIG. 8 and FIG. 9. The 20 dB down line-widths of these two pump lasers are 66.6 kHz (SMFL) and 0.98 MHz (ECL), and the corresponding Lorentzian line-widths are calculated to be 3.33 kHz and 49.0 kHz, respectively.

Secondly, the simple structure with bi-directional pumped BRFL is used in the line-width measurement. In accordance to the configuration illustrated in FIG. 3, two narrow line-width test lasers (SMFL and ECL) are used as the pump source, respectively. The optical interference signal resulting from the superimposition of the Brillouin Stokes and test laser is detected by a photodiode with a bandwidth of approximately 350 MHz and the associated power spectrum is measured and recorded with an ESA set to the same parameters disclosed above. The power spectrum measurements, using the disclosed BRFL-based technique are illustrated along-side the measurements using the conventional self-heterodyne technique, for a single mode (SM) fiber test laser and an external cavity test laser, in FIG. 8 and FIG. 9, respectively. All reported measurements are averaged over 20 measurements The Lorentzian line-widths of the SMFL and ECL are calculated to be approximately 3.23 kHz and 50.0 kHz, respectively. All the measured results for both techniques are listed in Table 1.

From Table 1, the line-widths of the two test lasers measured by conventional self-heterodyne and the disclosed BRFL-based technique agree well to within the uncertainty range. To ensure the validity of the optical resolution associated with the disclosed line-width characterization method, the reported BRFL line-width values of 65 Hz for SMFL and 75 Hz for ECL are averaged over 20 measurements. The optical resolution of the conventional self-heterodyne technique is determined by the delay fiber length, which is 2 kHz for 100 km.

TABLE 1

Line-widths of two pump lasers measured by different techniques

| | | Self-heterodyne Technique | | BRFL Technique | |
|---|---|---|---|---|---|
| SM Fiber Laser | 20 dB line-width | 66.6 kHz | 20 dB line-width | 64.6 kHz |
| | Lorentzian line-width | 3.33 kHz | Lorentzian line-width | 3.23 kHz |
| ECL Laser | 20 dB line-width | 0.98 MHz | 20 dB line-width | 1.00 MHz |
| | Lorentzian line-width | 49.0 kHz | Lorentzian line-width | 50.0 kHz |

All documenta, patents, journal articles and other materials cited in the present application are incorporated herein by reference.

Having described the various embodiments of the present invention in detail, it will be apparent that modifications and variations are possible without departing from the scope of the invention defined in the appended claims. Furthermore, it should be appreciated that all examples in the present disclosure, while illustrating many embodiments of the invention, are provided as non-limiting examples and are, therefore, not to be taken as limiting the various aspects so illustrated.

REFERENCES

The following references are referred to above and/or describe technology that may be used with the present invention and contents and disclosure of the following references are incorporated herein by reference:

1. S. Smith, F. Zarinetchi, and S. Ezekiel, "Narrow-linewidth stimulated Brillouin fiber laser and applications," Opt. Lett. 16(6), 393-395 (1991).
2. E. Ip, A. P. Lau, D. J. Barros, and J. M. Kahn, "Coherent detection in optical fiber systems," Opt. Express 16(2), 753-791 (2008).
3. F. Mihélic, D. Bacquet, J. Zemmouri, and P. Szriftgiser, "Ultrahigh resolution spectral analysis based on a Brillouin fiber laser," Opt. Lett. 35(3), 432-434 (2010).
4. J. Geng, S. Staines, and S. Jiang, "Dual-frequency Brillouin fiber laser for optical generation of tunable low-noise radio frequency/microwave frequency," Opt. Lett. 33(1), 16-18 (2008).
5. X. Bao, L. Chen, "Recent progress distributed fiber optic sensors," Sensors 12(7): 8601-8639 (2012).
6. K. N. Choi, H. F. Taylor, "Spectrally stable Er-fiber laser for application in phase-sensitive optical time-domain reflectometry," IEEE Photon. Technol. Lett. 15(3), 386-388 (2003).
7. J. Geng, C. Spiegelberg, S. Jiang, "Narrow line-width fiber laser for 100-km optical frequency domain reflectometry," IEEE Photon. Technol. Lett. 17(9), 1827-1829 (2005).
8. J. M. Campos, A. Destrez, J. Jacquet and Z. Toffano, "Ultra-fast optical spectrum analyzer for DWDM applications," IEEE Trans. Instrum. Meas. 53(1), 124-129 (2004).

9. R. Hui, and M. O'Sullivan, *Fiber Optic Measurement Techniques* (Academic, 2009).
10. T. Takakura, K. Iga, T. Tako, "Line-width measurement of a single longitudinal mode AlGaAs laser with Fabry-Perot Interferometer," Jpn. J. Appl. Phys. 19(12), L725-L727 (1980).
11. E. Ip, J. M. Kahn, D. Anthon, and J. Hutchins, "Line-width measurements of mems-based tunable lasers for phase-locking applications," IEEE Photon. Technol. Lett. 17(10):2029-2031 (2005).
12. L. D. Turner, K. P. Weber, C. J. Hawthorn, and R. E. Scholten, "Frequency noise characterization of narrow line-width diode lasers," Opt. Commun. 201(4-6): 391-397 (2002).
13. T. Okoshi, K. Kikuchi, A. Nakayama, "Novel method for high resolution measurement of laser output spectrum," Electron. Lett. 16(16), 630-631 (1980).
14. L. Richter, H. I. Mandelberg, M. Kruger and P. McGrath, "Line-width determination from self-heterodyne measurements with subcoherence delay times," IEEE J. Quantum Electron. 22(11), 2070-2074 (1986).
15. M. Han, A. Wang, "Analysis of a loss-compensated recirculating delayed self-heterodyne interferometer for laser line-width measurement," Appl. Phys. B 81(1), 53-58 (2005).
16. X. Chen, M. Han, Y. Zhu, B. Dong and A. Wang, "Implementation of a loss-compensated recirculating delayed self-heterodyne interferometer for ultranarrow laser line-width measurement," Appl. Opt. 45(29), 7712-7717 (2006).
17. J. Reid, D. T. Cassidy, R. T. Menzies, "Line-width measurements of tunable diode lasers using heterodyne and etalon techniques," Appl. Opt. 21(21), 3961-3965 (1982).
18. F. Mihélic, D. Bacquet, J. Zemmouri, and P. Szriftgiser, "Ultrahigh resolution spectral analysis based on a Brillouin fiber laser," Opt. Lett. 35(3), 432-434 (2010).
19. J. M. S. Domingo, J. Pelayo, F. Villuendas, C. D. Heras, and E. Pellejer, "Very High Resolution Optical Spectrometry by Stimulated Brillouin Scattering," IEEE Photon. Technol. Lett. 17(4), 855-857 (2005).
20. P. Sevillano, J. Subías, C. Heras, J. Pelayo and F. Villuendas, "Brillouin induced self-heterodyne technique for narrow line width measurement," Opt. Express 18(14), 15201-15206 (2010).
21. M. Pang, S. Xie, X. Bao, D. Zhou, Y. Lu and L. Chen, "Rayleigh scattering-assisted narrow line-width Brillouin lasing in cascaded fibers," Opt. Lett. 37(15), 3129-3131 (2012).
22. A. Yeniay, J. M. Delavaux, and J. Toulouse, "Spontaneous and stimulated Brillouin scattering gain spectra in optical fibers," IEEE J. Lightwave Technol. 20(8), 1425-1432 (2002).
23. A. A. Fotiadi, R. V. Kiyan, "Cooperative stimulated Brillouin and Rayleigh backscattering process in optical fiber," Opt. Lett. 23(23), 1805-1807 (1998).
24. R. W. Boyd, and K. Rzazewski, "Noise initiation of stimulated Brillouin scattering," Phys. Rev. A 42(9), 5514-5521 (1990).
25. H. Cao, "Lasing in random media," Waves in random media 13(3), R1-R39 (2003).
26. T. Kessler, C. Hagemann, C. Grebing, T. Legero, U. Sterr, F. Riehle, M. J. Martin, L. Chen and J. Ye, "A sub-40-mHz-line-width laser based on a silicon single-crystal optical cavity," Nat. Photon. 6(10), 687-692 (2012).
27. L. B. Mercer, "1/f frequency noise effects on self-heterodyne line-width measurements," IEEE J. Lightwave Technol. 9(4), 485-493 (1991).

What is claimed is:

1. A method comprising:
producing at least two optical pump signals from an optical pump source, and launching the at least two optical pump signals into a disordered gain medium at two points such that the optical pump signals propagate in a direction through the disordered gain medium towards one another; and
measuring a line-width of the optical signal generated within the disordered gain medium to thereby characterize a line-width of the optical pump source.

2. The method of claim 1, wherein the optical signal within the disordered gain medium is generated from an interaction between the at least two optical pump signals propagating in a direction towards one another and the disordered gain medium.

3. The method of claim 2, wherein the interaction includes a bi-directional stimulated Brillouin scattering (SBS) amplification of a Rayleigh back-scattered stokes signal.

4. The method of claim 1, wherein the two points include opposite ends of the disordered gain medium.

5. The method of claim 1, wherein the disordered gain medium is an optical gain fiber.

6. The method of claim 1, comprising splitting an output of the optical pump source into at least two optical pump signals using a 50/50 optical coupler.

7. The method of claim 1, comprising amplifying an output of the optical pump source prior to splitting it into the at least two optical pump signals.

8. The method of claim 7, wherein the amplification is performed with an erbium-doped fiber amplifier (EDFA) device.

9. The method of claim 5, comprising launching one of the at least two optical pump signals into one end of the optical gain fiber through an optical isolator.

10. The method of claim 9, comprising launching another one of the at least two optical pump signals into another end of the optical gain fiber through an optical circulator.

11. The method of claim 1, comprising extracting the optical signal generated within the disordered gain medium as a result of an interaction between the at least two optical pump signals and the disordered gain medium.

12. The method of claim 11, comprising detecting the extracted optical signal with a square law detector.

13. The method of claim 12, wherein the square law detector is a photodiode.

14. The method of claim 12, comprising measuring a line-width of the square law detector output using an electrical spectrum analyzer (ESA).

15. The method of claim 1, wherein a line-width of a single mode fiber laser and an external cavity laser is characterized with a resolution of approximately 65 Hz and 75 Hz, respectively.

16. The method of claim 1, wherein the at least two optical pump signals are propagated in opposite directions to one another.

* * * * *